United States Patent
Chiba et al.

(10) Patent No.: US 10,553,818 B2
(45) Date of Patent: Feb. 4, 2020

(54) METHOD FOR MANUFACTURING ORGANIC ELECTRONIC DEVICE SEALING BODY

(71) Applicant: ZEON CORPORATION, Chiyoda-ku, Tokyo (JP)

(72) Inventors: Daido Chiba, Tokyo (JP); Teiji Kohara, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/080,750

(22) PCT Filed: Mar. 13, 2017

(86) PCT No.: PCT/JP2017/009892
§ 371 (c)(1),
(2) Date: Aug. 29, 2018

(87) PCT Pub. No.: WO2017/159589
PCT Pub. Date: Sep. 21, 2017

(65) Prior Publication Data
US 2019/0067632 A1    Feb. 28, 2019

(30) Foreign Application Priority Data
Mar. 18, 2016 (JP) ................. 2016-055259

(51) Int. Cl.
*H01L 51/52* (2006.01)
*C09K 3/10* (2006.01)
(Continued)

(52) U.S. Cl.
CPC ........ *H01L 51/5246* (2013.01); *C08F 297/04* (2013.01); *C09K 3/10* (2013.01);
(Continued)

(58) Field of Classification Search
CPC ............... H01L 31/0481; H01L 31/048; H01L 51/0043; H01L 51/448; H01L 51/5237;
(Continued)

(56) References Cited

U.S. PATENT DOCUMENTS

2004/0260028 A1   12/2004   Sone
2008/0220245 A1   9/2008   Suzuki et al.
(Continued)

FOREIGN PATENT DOCUMENTS

JP    S59133203 A    7/1984
JP    S6079005 A    5/1985
(Continued)

OTHER PUBLICATIONS

Oct. 9, 2019, the Extended European Search Report issued by the European Patent Office in the corresponding uropean Patent Application No. 17766589.0.

*Primary Examiner* — Jaehwan Oh
(74) *Attorney, Agent, or Firm* — Kenja IP Law PC

(57) ABSTRACT

The invention is a method for manufacturing an organic electronic device sealing body, adhesively integrating an organic electronic device with a sheet-like sealant made of a modified hydrocarbon-based soft resin having an alkoxysilyl group, the method comprising steps of: step [1]: laminating the organic electronic device and the sheet-like sealant to obtain a laminate; step [2]: putting the resulting laminate into a resin bag, degassing the bag, and then sealing the bag containing the laminate; and step [3]: placing the sealed bag under a pressure of 0.1 MPa or higher to adhesively integrate the laminate. One aspect of the invention provides a method for manufacturing an organic electronic device sealing body which allows industrially-advantageous sealing of the organic electronic device including
(Continued)

organic functional elements such as an organic EL element and an organic semiconductor element.

4 Claims, 2 Drawing Sheets

(51) Int. Cl.
*C08F 297/04* (2006.01)
*H01L 51/00* (2006.01)

(52) U.S. Cl.
CPC ...... *H01L 51/0043* (2013.01); *H01L 51/5253* (2013.01); *C09K 2200/0645* (2013.01)

(58) Field of Classification Search
CPC .................................................. H01L 51/524; H01L 51/5246; H01L 51/5253
See application file for complete search history.

(56) References Cited

U.S. PATENT DOCUMENTS

| | | | |
|---|---|---|---|
| 2013/0244367 A1* | 9/2013 | Kohara | ................ C08F 287/00 |
| | | | 438/64 |
| 2015/0183922 A1* | 7/2015 | Nakagawa | ......... C08G 18/6279 |
| | | | 136/256 |
| 2015/0307758 A1 | 10/2015 | Tazaki et al. | |
| 2015/0329750 A1* | 11/2015 | Ishiguro | ............... C09J 153/005 |
| | | | 525/98 |

FOREIGN PATENT DOCUMENTS

| | | |
|---|---|---|
| JP | S6128507 A | 2/1986 |
| JP | 2005129520 A | 5/2005 |
| JP | 2006183002 A | 7/2006 |
| WO | 9634896 A1 | 11/1996 |
| WO | 03018656 A1 | 3/2003 |
| WO | 2012043708 A1 | 4/2012 |
| WO | 2013165637 A1 | 11/2013 |
| WO | 2014077267 A1 | 5/2014 |
| WO | 2014091941 A1 | 6/2014 |

* cited by examiner

METHOD FOR MANUFACTURING ORGANIC ELECTRONIC DEVICE SEALING BODY

TECHNICAL FIELD

The present invention relates to a method for manufacturing an organic electronic device sealing body.

BACKGROUND ART

A sealing member may be provided in an organic electronic device including elements such as an organic electroluminescent element (hereinafter referred to as "organic EL element" in some cases) and an organic semiconductor element. Deterioration of the organic functional element due to water vapor and oxygen can be prevented and thus reduction of device performance can be prevented by providing such a sealing member so as to seal the organic functional element in the device.

As such a sealing member, materials such as a flexible sealant containing a styrene/diene-based elastomer (Patent Literature 1) and an epoxy-based sealant having a hydroxyl group (Patent Literature 2) are known. When such a sealant is used, the organic functional element can be sealed and unevenness of the device can be covered to improve strength of the device.

However, there have been problems that the above-described sealant is insufficient in preventing moisture from entering from the interface with a substrate because of poor adhesiveness with the substrate, and insufficient in moisture barrier property because of including a polar group, and thus insufficient in function of preventing deterioration of the organic functional element due to moisture entering from the outside.

Patent Literature 3 discloses an organic functional element sealant made of a specific hydrogenated block copolymer having an alkoxysilyl group as a material for solving the problems of conventional sealing members. Since this sealant is excellent in adhesiveness with the substrate and moisture barrier property, an organic electronic device sealing body in which the organic functional element is sufficiently sealed and also durability is excellent is provided when the sealant is used for sealing the organic electronic device.

CITATION LIST

Patent Literature

Patent Literature 1: JP-A-2005-129520 (US 2008/220245 A1)
Patent Literature 2: JP-A-2006-183002
Patent Literature 3: WO 2014/091941 (US 2015/0307758 A1)

SUMMARY OF INVENTION

Technical Problem

The object of the present invention is to provide a method for manufacturing an organic electronic device sealing body, which allows industrially advantageous sealing of an organic electronic device including organic functional elements such as an organic EL element and an organic semiconductor element by using a sealant made of a resin having excellent sealing performance for the organic functional elements.

Solution to Problem

In order to solve the above-mentioned problems, the inventors of the present invention conducted intensive studies. As a result, the inventors have found that a sheet-like sealant made of a modified hydrocarbon-based soft resin having an alkoxysilyl group and an organic electronic device are laminated and heat-pressed in an autoclave to obtain conformability to the shape and firm adhesiveness between the sealant and a substrate of the device, and this finding has led to the completion of the invention.

Thus, aspects of the invention provide methods for manufacturing an organic electronic device sealing body according to the following (1) to (5).

(1) A method for manufacturing an organic electronic device sealing body, adhesively integrating an organic electronic device with a sheet-like sealant made of a modified hydrocarbon-based soft resin having an alkoxysilyl group, the method comprising steps of:
step [1]: laminating the organic electronic device and the sheet-like sealant to obtain a laminate;
step [2]: putting the resulting laminate into a resin bag, degassing the bag, and then sealing the bag containing the laminate; and
step [3]: placing the sealed bag under a pressure of 0.1 MPa or higher to adhesively integrate the laminate.

(2) The method for manufacturing the organic electronic device sealing body according to (1), wherein the organic electronic device is an organic electronic device including an organic EL element.

(3) The method for manufacturing the organic electronic device sealing body according to (1) or (2), wherein the modified hydrocarbon-based soft resin having the alkoxysilyl group is a modified hydrocarbon-based soft resin obtained by introducing the alkoxysilyl group into at least one hydrocarbon-based resin selected from a hydrogenated block copolymer (i) obtained by hydrogenating block copolymers composed of a polymer block mainly including an aromatic vinyl compound and a polymer block mainly including a chain conjugated diene compound, and a polyolefin-based resin (ii).

(4) The method for manufacturing the organic electronic device sealing body according to (3), wherein the hydrogenated block copolymer (i) is a hydrogenated block copolymer (ia) obtained by hydrogenating 90% or more of carbon-carbon unsaturated bonds on a main chain and a side chain and carbon-carbon unsaturated bonds in an aromatic ring in a block copolymer (C) composed of at least two polymer blocks (A) mainly including a structural unit derived from an aromatic vinyl compound and at least one polymer block (B) mainly including a structural unit derived from a chain conjugated diene compound, wherein when a weight fraction of the whole polymer block (A) relative to the whole block copolymer (C) is defined as wA and a weight fraction of the whole polymer block (B) relative to the whole block copolymer (C) is defined as wB, a ratio of wA and wB, wA:wB is 20:80 to 60:40.

(5) The method for manufacturing the organic electronic device sealing body according to any one of (1) to (4), wherein the resin bag is composed of a single-layer or multi-layer sheet having at least one layer made of polypropylene.

Advantageous Effects of Invention

One aspect of the invention provides a method for manufacturing an organic electronic device sealing body which allows industrially-advantageous sealing of the organic electronic device including organic functional elements such as an organic EL element and an organic semiconductor element.

In accordance with the method according to one embodiment of the invention, even an organic electronic device having a curved shape can be easily sealed.

The method for manufacturing an organic electronic device sealing body according to one embodiment of the invention is useful as a method for industrially manufacturing the organic electronic device sealing body excellent in durability and using a sealant made of a resin having excellent sealing performance for the organic functional elements.

In addition, the organic electronic device sealing body manufactured in accordance with the manufacturing method according to one embodiment of the invention is excellent in durability.

DESCRIPTION OF EMBODIMENTS

The method for manufacturing the organic electronic device sealing body according to one embodiment of the invention is a method; adhesively integrating an organic electronic device with a sheet-like sealant made of a modified hydrocarbon-based soft resin having an alkoxysilyl group and the method comprising the following steps [1] to [3]:

step [1]: laminating the organic electronic device and the sheet-like sealant to obtain a laminate;

step [2]: putting the resulting laminate into a resin bag, degassing the bag, and then sealing the bag containing the laminate; and step [3]: placing the sealed bag under a pressure of 0.1 MPa or higher to adhesively integrate the laminate.

Hereinafter, the embodiments of the present invention are classified into 1. organic electronic device, 2. sealant, 3. step [1], 4. step [2], and 5. step [3], and described in detail.

1. Organic Electronic Device

The organic electronic device used in the present invention has organic functional elements such as an organic EL element and an organic semiconductor element as well as a substrate having sealing ability, as an organic functional element that expresses the function of the device.

In accordance with the manufacturing method according to one embodiment of the invention, an organic electronic device having a form that the organic functional element is sealed with such a substrate and sealant is obtained.

An organic electronic device having an organic EL element as an organic functional element will be taken as an example and explained with reference to drawings.

Figure 1:
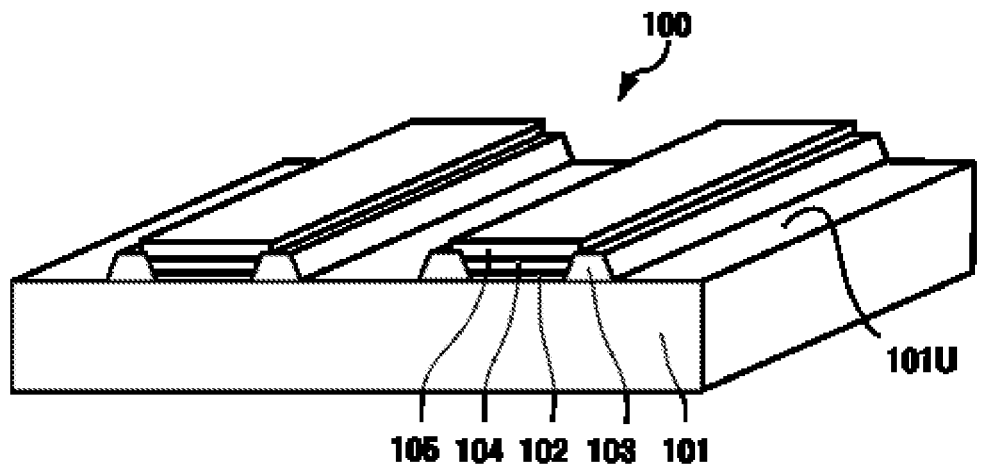
FIG. 1 illustrates a perspective view schematically showing an assembly constituting an organic electronic device including constituents such as an organic EL element.

FIG. 1 illustrates a perspective view schematically showing an assembly constituting an organic electronic device including constituents such as an organic EL element used in the manufacturing method according to one embodiment of the invention.

In FIG. 1, an assembly 100 has a substrate 101, a large number of first electrode layers 102 formed into an elongated strip shape on an upper surface 101U of the substrate 101, edge cover layer 103 formed around the first electrode layer 102, light-emitting layer 104 provided on the first electrode layer 102, and second electrode layer 105 provided on the light-emitting layer 104.

The first electrode layer 102, the light-emitting layer 104 and the second electrode layer 105 constitute a light emitter, which can emit light from light-emitting layers by powering the first and second electrode layers.

The materials, thicknesses and manufacturing methods of the elements for constituting the assembly 100 are not particularly limited, and known ones can be adopted.

Examples of the substrate material include a flexible substrate made of a flexible transparent plastic such as polycarbonate, polyethylene terephthalate, polyethylene naphthalate, alicyclic olefin polymer; a glass substrate such as quartz, soda glass, inorganic alkaline glass; and the like.

Although the light-emitting layer is not particularly limited and known one can be appropriately selected, it may be a light-emitting layer capable to emit light including a desired peak wavelength with one layer alone or a combination of a plurality of layers so as to conform to an application as a light source.

Materials for constituting the first and second electrode layers are not particularly limited, and a known material used as an electrode for an organic EL element can be appropriately selected. Either one of the first or second electrode layers may be an anode and the other one may be a cathode. Either one of the first electrode layer or the second electrode layer is used as a transparent electrode and the other one is used as a reflective electrode, so that light emission from the transparent electrode side can be achieved.

In addition, both of the first and second electrode layers can be used as transparent electrodes. Examples of materials for the transparent electrode include a metal thin film, ITO (indium tin oxide), IZO (indium oxide-zinc oxide), $SnO_2$, ZnO—Al, ZnO—Ga and the like.

Examples of materials for the reflective electrode layer may include Ag, Al and the like.

Between the first and second electrode layers, any layer such as a light-emitting layer, as well as a hole injection layer, a hole transport layer, an electron transport layer, an electron injection layer and a gas barrier layer can be further provided. These layers can also be constituents of the light emitter.

Specific examples of the layer configuration of the light emitter include a configuration of anode/hole transport layer/light-emitting layer/cathode, a configuration of anode/hole transport layer/light-emitting layer/electron injection layer/cathode, a configuration of anode/hole injection layer/light-emitting layer/cathode, a configuration of anode/hole injection layer/hole transport layer/light-emitting layer/electron transport layer/electron injection layer/cathode, a configuration of anode/hole transport layer/light-emitting layer/electron injection layer/equipotential surface-forming layer/hole transport layer/light-emitting layer/electron injection layer/cathode, a configuration of anode/hole transport layer/light-emitting layer/electron injection layer/charge-generating layer/hole transport layer/light-emitting layer/electron injection layer/cathode, and the like.

The light emitter in the organic electronic device used in the manufacturing method according to one embodiment of the invention can include one or more light-emitting layers between the anode and the cathode. In addition, the light-emitting layer may be a laminate of a plurality of layers having different luminescent colors, or alternatively a layer having a mixed layer including some dye layers doped with different dyes.

Examples of materials constituting the light-emitting layer may include a polyparaphenylenevinylene-based material, a polyfluorene-based material and a polyvinyl carbazole-based material.

Examples of materials for the hole injection layer and the hole transport layer may include a phthalocyanine-based material, an arylamine-based material and a polythiophene-based material.

Examples of materials for the electron injection layer and the electron transport layer may include an aluminum complex and lithium fluoride.

Examples of materials for the equipotential surface-forming layer and the charge-generating layer may include transparent electrodes such as ITO, IZO and $SnO_2$, and metal thin films such as Ag and Al.

The first electrode layer, the light-emitting layer, the second electrode layer, and any other layers constituting the light emitter can be provided by sequentially laminating them on the substrate. The thickness of each of these layers can be 10 to 1000 nm.

The assembly 100 may further include any constituents such as wires for powering the electrode layer.

Figure 2:
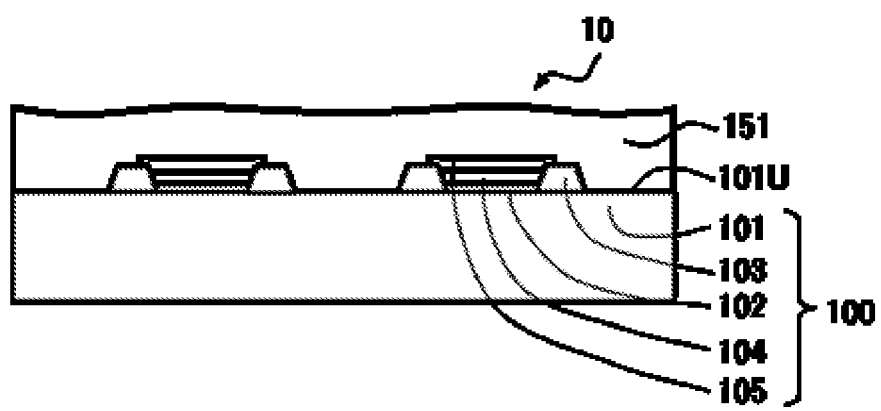
FIG. 2 illustrates a longitudinal sectional view schematically showing an example of an organic electronic device sealing body sealed with a resin composed of the assembly shown in FIG. 1 and a sealant layer.

FIG. 2 illustrates a longitudinal sectional view schematically showing an example of an organic electronic device sealing body sealed with a resin composed of the assembly and the sealant layer and which is manufactured by the manufacturing method according to one embodiment of the invention.

In FIG. 2, an organic electronic device sealing body 10 includes the assembly 100, and a sealant layer 151 provided on the upper surface 101U side of the assembly 100. Inclusion of such a structure allows the light emitting layer 104 to be sealed with the substrate 101 and the sealant layer 151. Furthermore, since the sealant layer 151 is a sealant layer made of the hydrocarbon-based soft resin having an alkoxysilyl group used in the present invention, it is excellent in moisture barrier property. As a result, sufficient sealing is achieved and durability of the device is improved. Furthermore, unevenness of the assembly 100 is covered because of the flexible property of the sealant, and as a result, the strength of the device can be improved.

In the present invention, as a method of providing the sealant layer 151 on the assembly 100, a method in which a substrate equipped with an organic functional element is overlapped with the sheet-like sealant to be press-bonded in an autoclave is adopted.

Figure 3:
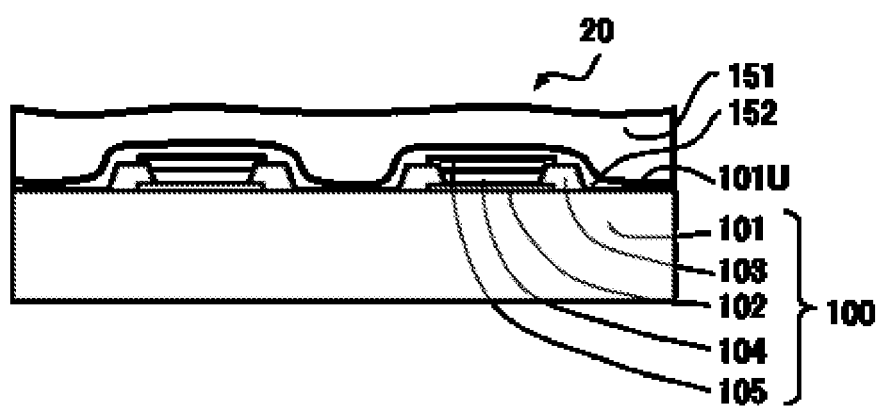
FIG. 3 illustrates a longitudinal sectional view schematically showing another example of the organic electronic device sealing body sealed with a sealant.

FIG. 3 illustrates a longitudinal sectional view schematically showing another example of the organic electronic device sealing body sealed with a resin which is manufactured by the manufacturing method according to one embodiment of the invention.

In FIG. 3, an organic electronic device sealing body 20 includes the assembly 100, a provisional sealing layer 152 provided on the upper surface 101U side of the assembly 100, and the sealant layer 151 provided on the provisional sealing layer 152.

Examples of the material for the provisional sealing layer 152 include silicon-containing materials such as silicon nitride (SiN) and silicon oxide (SiO).

The thickness of the provisional sealing layer 152 is about 0.2 to 1 µm.

The provisional sealing layer 152 can be formed by a film forming method such as vapor deposition in the condition under reduced-pressure environment similar to that for the light-emitting layer 104 and the second electrode layer 105.

Deterioration of the light-emitting layer can be effectively suppressed by continuously providing the light-emitting layer 104, the second electrode layer 105 and the provisional sealing layer 152 under reduced-pressure environment. In addition, the above-described layers may be taken out from the reduced-pressure environment and then sealed with the sealant layer 151 to obtain a sealed body resistible to the usage environment of the device.

Thereby, a device in which deterioration of the element during manufacture is reduced and the state is maintained for a long period also under the usage environment, can be obtained.

Figure 4:
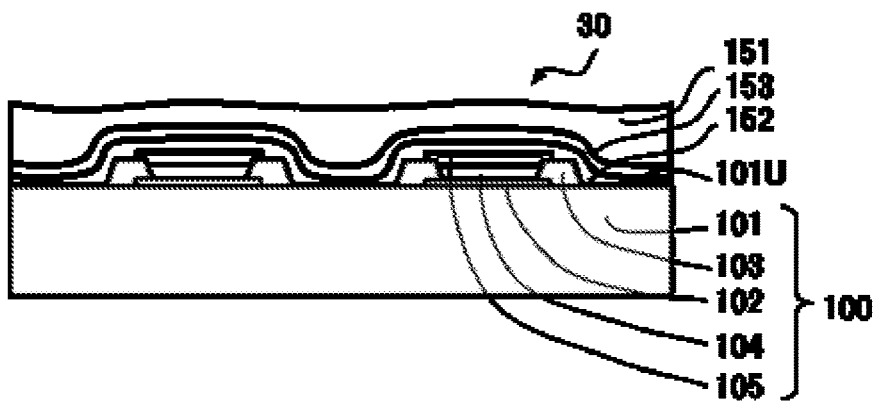
FIG. 4 illustrates a longitudinal sectional view schematically showing still another example of the organic electronic device sealing body sealed with a sealant.

FIG. 4 illustrates a longitudinal sectional view schematically showing still another example of the organic electronic device sealing body sealed with a resin which is manufactured by the manufacturing method according to one embodiment of the invention.

In FIG. 4, an organic electronic device sealing body 30 includes the assembly 100, the provisional sealing layer 152 provided on the upper surface 101U side of the assembly 100, an adsorbent layer 153 provided on the provisional sealing layer 152, and the sealant layer 151 provided on the adsorbent layer 153.

Examples of the material for the adsorbent layer 153 may include an organoaluminum complex. The thickness of the adsorbent layer 153 is about 0.1 to 1 µm.

The sealing property can be further firmed by providing the adsorbent layer 153. For example, a trace amount of gas components releasable from the sealant layer 151 can be adsorbed to further prevent deterioration of the layer such as the light-emitting layer 104.

Figure 5:
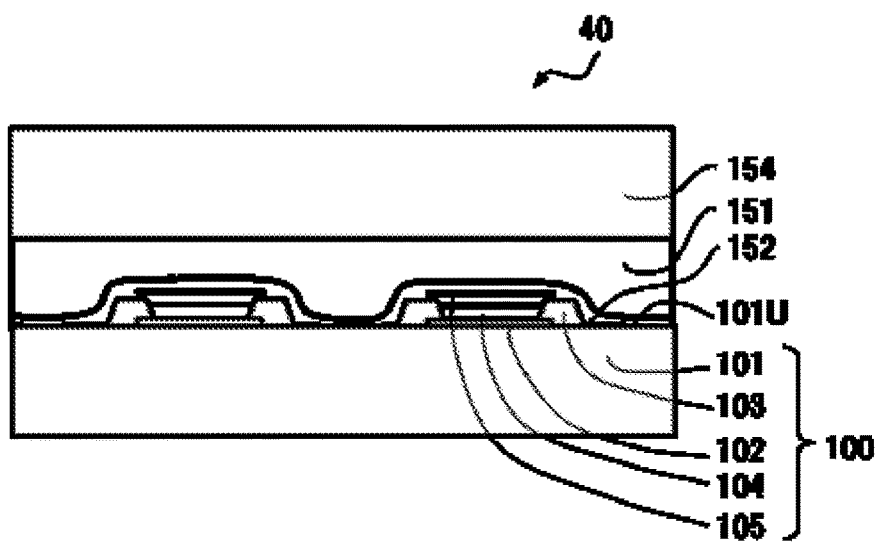
FIG. 5 illustrates a longitudinal sectional view schematically showing still another example of the organic electronic device sealing body sealed with a sealant.

FIG. 5 illustrates a longitudinal sectional view schematically showing an example of the organic electronic device sealing body sealed with a resin composed of the assembly, the sealant layer and the protective layer and manufactured by the manufacturing method according to one embodiment of the invention.

In FIG. 5, an organic electronic device sealing body 40 includes the assembly 100, the sealant layer 151 provided on the upper surface 101U side of the assembly 100, and furthermore a protective layer 154 on the upper surface thereof. Inclusion of such a structure allows the light-emitting layer 104 to be sealed with the substrate 101, the sealant layer 151 and the protective layer 154. Furthermore, since the sealant layer 151 is a sealant layer made of the hydrocarbon-based soft resin having an alkoxysilyl group used in the present invention, it is excellent in moisture barrier property.

As a result, sufficient sealing is achieved and durability of the device is improved. Furthermore, unevenness of the assembly 100 is covered because of the flexible property of the sealant, and as a result, the strength of the device can be improved.

Specific examples of the organic electronic device sealing body having an organic semiconductor as an organic functional element will be explained with reference to drawings.

Figure 6:
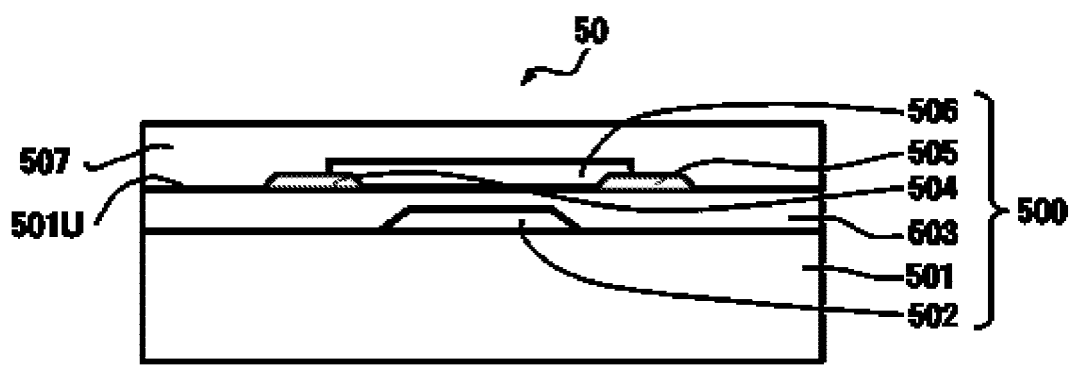
FIG. 6 illustrates a longitudinal sectional view schematically showing still another example of the organic electronic device sealing body sealed with a sealant and including constituents such as an organic semiconductor.

FIG. 6 illustrates a longitudinal sectional view schematically showing still another example of the organic electronic device sealing body including constituents such as a resin-sealed organic semiconductor, which is manufactured by the manufacturing method according to one embodiment of the invention.

In FIG. 6, an organic electronic device sealing body 50 has an assembly 500 and a sealant layer 507 provided on the upper surface of the assembly 500. The assembly 500 has a substrate 501, a gate electrode 502 provided on the upper surface of the substrate 501, a gate electrode insulating layer 503 provided on the upper surfaces of the substrate 501 and the gate electrode 502, as well as a semiconductor layer 506 provided on the upper surface of the gate electrode insulating layer 503, a source electrode 504, and a drain electrode 505.

Materials, thicknesses and manufacturing methods of the elements constituting the organic electronic device sealing body 50 are not particularly limited and known ones can be adopted.

The material of the substrate 501 is not particularly limited, and examples thereof may include a flexible substrate made of a flexible plastic such as polycarbonate, polyimide, polyethylene terephthalate, polyethylene naphthalate and alicyclic olefin polymer; a glass substrate such as quartz, soda glass and inorganic alkaline glass; a wafer substrate such as silicon wafer, silicon carbide wafer, sapphire wafer and compound semiconductor wafer; and the like.

The gate electrode 502 may be formed of a conductive material. Examples of the conductive material include platinum, gold, silver, nickel, chromium, copper, iron, tin, antimony lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste and carbon paste, lithium, beryllium, magnesium, potassium, calcium, scandium, titanium, manganese, zirconium, gallium, niobium, sodium, sodium/potassium alloy, magnesium/copper mixture, magnesium/silver mixture, magnesium/aluminum mixture, magnesium/indium mixture, aluminum/aluminum oxide mixture, lithium/aluminum mixture, and the like.

In addition, a known conductive polymer of which the conductivity is improved by doping or the like e.g. conductive polyaniline, conductive polypyrrole, conductive polythiophene (a complex of polyethylene dioxythiophene and polystyrene sulfonic acid, etc.) can also be used as a conductive material. Above all, chromium and molybdenum are preferred, and chromium is more preferred.

The gate electrode 502 is formed in a predetermined pattern on the substrate 501 e.g. by forming the above-described conductive material on the substrate 501 through sputtering or the like and then carrying out etching treatment.

The material for the gate electrode insulating layer 503 is preferably a material having sealing property, moisture resistance, insulating property and chemical resistance. Specifically, it can be exemplified by thermoplastic resins such as polyimide, polyester, polyethylene naphthalate, polycarbonate, polyethylene, polyethylene terephthalate and polyether sulfone, but the same resin as the sealant layer 507 can also be used.

The semiconductor layer 506 may be formed of an organic semiconductor. Examples of the organic semiconductor include, as a p-channel type, a low-molecular-weight semiconductor such as pentacene, naphthacene, thiophene oligomer, perylene, p-sexiphenyl and derivatives thereof, naphthalene, anthracene, rubrene, and derivatives thereof, coronene and a derivative thereof, metal-containing/non-metal-containing phthalocyanine and a derivative thereof; a high-molecular-weight semiconductor such as polyalkylthiophene and polyalkylfluorene based on thiophene and fluorene, and derivatives thereof; and the like.

The semiconductor layer 506 is formed e.g. by forming the layer of the above-described organic semiconductor on the gate electrode insulating layer 503 through coating, CVD or the like and then patterning it so as to have a predetermined patterned shape.

The source electrode 504 and the drain electrode 505 can be formed of a conductive material. As the conductive material, the material similar to that for the above-described gate electrode 502 can be used. The source electrode 504 and the drain electrode 505 are formed in a predetermined pattern on the semiconductor layer 506 e.g. by forming the layer of the above-described conductive material on the semiconductor layer 506 through sputtering or the like and then carrying out etching treatment.

In FIG. 6, the organic electronic device sealing body 50 as an organic semiconductor includes a sealant layer 507 provided on the upper surface 501U side of the assembly 500. Inclusion of such a structure allows the semiconductor layer 506, the source electrode 504 and the drain electrode 505 to be sealed with the gate electrode insulating layer 503 and the sealant layer 507. Furthermore, since the sealant layer 507 is a sealant layer made of the hydrocarbon-based soft resin having an alkoxysilyl group used in the present invention, it is excellent in moisture barrier property. As a result, sufficient sealing is achieved and durability of the device is improved. Furthermore, unevenness of the assembly 500 is covered because of the flexible property of the sealant, and as a result, the strength of the device can be improved.

2. Sealant

The sealant used in the present invention is a sheet-like sealant made of a modified hydrocarbon-based soft resin having an alkoxysilyl group.

The modified hydrocarbon-based soft resin having the alkoxysilyl group is a resin in which an alkoxysilyl group is introduced by reacting a hydrocarbon-based soft resin with an ethylenically unsaturated silane compound in the presence of an organic peroxide. Firm adhesiveness with a glass substrate or a plastic substrate is provided to the hydrocarbon-based soft resin by introducing the alkoxysilyl group into the hydrocarbon-based soft resin.

The modified hydrocarbon-based soft resin having the alkoxysilyl group is a soft resin having a dynamic viscoelastic property with a storage elastic modulus G' of normally $1 \times 10^6$ to $1 \times 10^9$ Pa, preferably $1 \times 10^7$ to $5 \times 10^8$ Pa at 25° C.

In relation to the storage elastic modulus G', viscoelastic property is measured using a known dynamic viscoelasticity measuring device e.g. a viscoelasticity measuring device (ARES, manufactured by TA Instruments Japan Inc.) in accordance with JIS K7244-2 method (Plastics—Determination of dynamic mechanical properties—Part 2: torsion pendulum method) under a condition of angular frequency: 1 rad/s, and from the resulting measured values, a value of the storage elastic modulus at 25° C. can be determined.

The flexible resin having a storage elastic modulus G' within the above range is used as a sealant, so that sealing of the element can be achieved and unevenness of the device can be covered to improve strength of the device.

(Hydrocarbon-Based Soft Resin)

The hydrocarbon-based soft resin as a raw material for the sealant used in the present invention is at least one hydrocarbon-based soft resin selected from hydrogenated block copolymer (i) obtained by hydrogenating a block copolymer [block copolymer (C)] composed of a polymer block mainly including a structural unit derived from an aromatic vinyl compound [polymer block (A)] and a polymer block mainly including a structural unit derived from a chain conjugated diene compound [polymer block (B)], and polyolefin-based resin (ii).

[Hydrogenated Block Copolymer (i)]

The hydrogenated block copolymer (i) is a polymer obtained by hydrogenating the block copolymer (C).

In the block copolymer (C), the number of the polymer blocks (A) is normally 3 or less, and preferably 2 or less, and the number of the polymer blocks (B) is normally 2 or less, and preferably 1.

The block form of the block copolymer (C) may be a chain type block or a radial type block, but the chain type block is preferred because it is excellent in mechanical strength. The most preferred form of the block copolymer (C) is a (A)-(B)-(A) type triblock copolymer in which the polymer blocks (A) bind to both ends of the polymer block (B).

Each of the plural polymer blocks (A) may be the same as or different from each other. When there are a plurality of polymer blocks (B), each of the polymer blocks (B) may be the same as or different from each other.

The molecular weight of the block copolymer (C) refers to a weight average molecular weight (Mw) in terms of polystyrene determined by gel permeation chromatography (GPC) using tetrahydrofuran (THF) as a solvent, and is normally 30,000 or more, preferably 35,000 or more, more preferably 40,000 or more, and normally 150,000 or less, preferably 100,000 or less, more preferably 70,000 or less. Furthermore, it is normally 30,000 to 150,000, preferably 35,000 to 100,000, and more preferably 40,000 to 70,000.

The molecular weight distribution (Mw/Mn) of the block copolymer (C) is preferably 3 or less, more preferably 2 or less, particularly preferably 1.5 or less. When the Mw and the Mw/Mn are within the above ranges, a sealant having sufficient sealing property and mechanical strength is obtained.

In the block copolymer (C), a ratio of wA and wB, wA:wB is 20:80 to 60:40, preferably 25:75 to 55:45, more preferably 30:70 to 50:50. When the ratio wA:wB is within this range, a sealant having sufficient sealing property and heat resistance is obtained.

The polymer block (A) included in the block copolymer (C) mainly includes an aromatic vinyl compound, and the content of the structural unit derived from the aromatic vinyl compound in the polymer block (A) is normally 95 wt % or more, preferably 97 wt % or more, and more preferably 99 wt % or more. The polymer block (A) may contain a structural unit derived from a chain conjugated diene and/or a structural unit derived from another vinyl compound as components other than the structural unit derived from the aromatic vinyl compound.

The content thereof is normally 5 wt % or less, preferably 3 wt % or less, and more preferably 1 wt % or less.

If the content of the structural unit derived from the aromatic vinyl compound in the polymer block (A) is too small, the heat resistance of the sealant may be decreased.

Specific examples of the aromatic vinyl compound include styrene, 2-methylstyrene, 3-methylstyrene, 4-methylstyrene, 2,4-diisopropylstyrene, 2,4-dimethylstyrene, 4-t-butylstyrene, 5-t-butyl-2-methylstyrene, 4-monochlorostyrene, dichlorostyrene, 4-monofluorostyrene, 4-phenylstyrene and the like. Above all, the compounds having no polar group are preferred from the viewpoint of low dielectric constant and low hygroscopicity, and styrene is particularly preferred from the viewpoint of industrial availability.

The copolymerizable chain conjugated diene and other vinyl compounds can be exemplified by those similar to the chain conjugated diene and other vinyl compounds which are to be the structural units of the polymer block (B) described later.

The polymer block (B) mainly includes a chain conjugated diene compound, and the content of the structural unit derived from the chain conjugated diene compound in the polymer block (B) is normally 95 wt % or more, preferably 97 wt % or more, and more preferably 99 wt % or more. As a component other than the structural unit derived from the chain conjugated diene compound in the polymer block (B), a structural unit derived from an aromatic vinyl compound and/or a structural unit derived from another vinyl compound can be included. The content thereof is normally 5 wt % or less, preferably 3 wt % or less, and more preferably 1 wt % or less.

When the content of the structural unit derived from the chain conjugated diene compound is within the above range, the sealant is excellent in adhesiveness.

Specific examples of the chain conjugated diene-based compound include 1,3-butadiene, isoprene, 2,3-dimethyl-1,3-butadiene, 1,3-pentadiene and the like. Above all, the chain conjugated diene-based compound containing no polar group is preferred from the viewpoint of hygroscopicity, and 1,3-butadiene and isoprene are particularly preferred from the viewpoint of industrial availability.

Examples of other vinyl-based compounds include a chain vinyl compound, a cyclic vinyl compound, an unsaturated cyclic acid anhydride, an unsaturated imide compound and the like. These compounds may have a substituent such as a nitrile group, an alkoxycarbonyl group, a hydroxycarbonyl group and a halogen atom. Above all, the compounds having no polar group, such as: a chain olefin having 2 to 20 carbon atoms such as ethylene, propylene, 1-butene, 1-pentene, 1-hexene, 1-heptene, 1-octene, 1-nonene, 1-decene, 1-dodecene, 1-eicosene, 4-methyl-1-pentene and 4,6-dimethyl-1-heptene; a cycloolefin having 5 to 20 carbon atoms such as vinylcyclohexane and norbornene; and a cyclodiene compound such as 1,3-cyclohexadiene and norbornadiene, are preferred from the viewpoint of hygroscopicity.

The hydrogenated block copolymer (i) is a polymer obtained by hydrogenating the block copolymer (C).

When the hydrogenated block copolymer (i) is a polymer obtained by hydrogenating only the carbon-carbon unsaturated bonds on the main chain and the side chain in the block copolymer (C), its hydrogenation ratio is normally 90% or higher, preferably 97% or higher, and more preferably 99% or higher. The higher the hydrogenation ratio is, the better the oxidative degradation resistance and the light resistance of the obtained sealant are.

Also, when the hydrogenated block copolymer (i) is a polymer obtained by hydrogenating the carbon-carbon unsaturated bonds on the main chain and the side chain as well as the carbon-carbon unsaturated bonds in the aromatic ring in the block copolymer (C), the hydrogenation ratio of the carbon-carbon unsaturated bonds in the main chain and the side chain is normally 90% or higher, preferably 97% or higher, and more preferably 99% or higher, and the hydrogenation ratio of the carbon-carbon unsaturated bonds in the aromatic ring is normally 90% or higher, preferably 97% or higher, and more preferably 99% or higher.

In addition, the hydrogenation ratio of the entire unsaturated bonds (the carbon-carbon unsaturated bonds on the main chain and the side chain and the carbon-carbon unsaturated bonds in the aromatic ring) in the block copolymer (C) is normally 90% or higher, preferably 97% or higher, more preferably 99% or higher. The higher the hydrogenation ratio is, the better the oxidative degradation resistance and the light resistance of the obtained sealant are.

The hydrogenation ratio of the hydrogenated black copolymer (i) can be determined by measuring $^1$H-NMR of the hydrogenated block copolymer (ia).

The hydrogenated block copolymer (i) can be produced in accordance with a known method. A hydrogenated block copolymer (ip) obtained by selectively hydrogenating only nonaromatic carbon-carbon unsaturated bonds on the main chain and side chain in the polymer block mainly including the structural unit derived from the chain conjugated diene compound can be produced in accordance with methods described in e.g. JP-A-59-133203, JP-A-60-079005, JP-A-61-028507 and the like.

In addition, the hydrogenated block copolymer (ia) obtained by hydrogenating aromatic and nonaromatic carbon-carbon unsaturated bonds on the main chain and side chain in the polymer block mainly including the structural unit derived from the aromatic vinyl compound and the polymer block mainly including the structural unit derived from the chain conjugated diene compound can be produced in accordance with methods described in e.g. WO 1996/34896 brochure, WO 2003/018656 brochure, WO 2012/043708 brochure and the like.

As the hydrogenated block copolymer (i), the hydrogenated block copolymer (ia) obtained by hydrogenating both aromatic and nonaromatic carbon-carbon unsaturated bonds on the main chain and side chain is preferred from the viewpoints of light resistance and heat resistance.

Among the hydrogenated block copolymers (ia), the hydrogenated block copolymer obtained by hydrogenating 90% or more of the carbon-carbon unsaturated bonds on the main chain and side chain and the carbon-carbon unsaturated bonds in the aromatic ring in the block copolymer (C) composed of at least two polymer blocks (A) mainly including the structural unit derived from the aromatic vinyl compound and at least one polymer block (B) mainly including the structural unit derived from the chain conjugated diene compound, wherein when the weight fraction of the whole polymer block (A) relative to the whole block copolymer (C) is defined as wA and the weight fraction of the whole polymer block (B) relative to the whole block copolymer (C) is defined as wB, the ratio of wA and wB, wA:wB is 20:80 to 60:40, is further preferred from the viewpoint of the sealing property and heat resistance of the organic electronic device.

Since the hydrogenated block copolymer (ia) produced by hydrogenating 90% or more of the carbon-carbon unsaturated bonds on the main chain and side chain and the carbon-carbon unsaturated bonds in the aromatic ring in the block copolymer (C) having a weight fraction within the above range has flexibility, damage to the organic EL element or the like can be reduced in the obtained sealant.

The molecular weight of the hydrogenated block copolymer (i) refers to a weight average molecular weight (Mw) in terms of polystyrene determined by GPC using THF as a solvent, and is normally 30,000 or more, preferably 35,000 or more, more preferably 40,000 or more, and normally 150,000 or less, preferably 100,000 or less, more preferably 70,000 or less. Furthermore, it is normally 30,000 to 150,000, preferably 35,000 to 100,000, and more preferably 40,000 to 70,000.

In addition, the molecular weight distribution (Mw/Mn) of the hydrogenated block copolymer (i) is preferably 3 or less, more preferably 2 or less, and particularly preferably 1.5 or less. When the Mw and the Mw/Mn are within the above ranges, a sealant having sufficient sealing property and mechanical strength is obtained.

[Polyolefin-Based Resin (ii)]

As the polyolefin-based resin (ii), a (co)polymer having a melting point of 90 to 140° C. and obtained by polymerizing ethylene and/or α-olefin having 3 to 10 carbon atoms can be used.

Examples of the α-olefin having 3 to 10 carbon atoms include propylene, 1-butene, 1-pentene, 1-hexene, 1-heptene, 1-octene, 4-methyl-1-pentene, vinylcyclohexane and the like. These olefins may be used either alone or in combination of two or more kinds.

The method of synthesizing the polyolefin is not particularly limited, and a general method is adopted.

In addition, among commercially available polyolefins produced using one or more olefins selected from a group consisting of ethylene and α-olefins having 3 to 10 carbon atoms, one having a melting point of 90 to 140° C., and preferably 100 to 130° C. can be selected for use.

When a polyolefin having a melting point of loser than 90° C. is used, the heat resistance as the sealant for the organic electronic device is poor, and when a polyolefin having a melting point of higher than 140° C. is used, the sealing property may be poor in the method for sealing the organic electronic device according to one embodiment of the invention.

Specific examples of usable polyolefins include low-density polyethylene, high-density polyethylene, ethylene/vinyl acetate copolymer, polypropylene, ethylene/propylene copolymer, ethylene/octene copolymer, poly-4-methylpentene and the like.

(Modified Hydrocarbon-Based Soft Resin Having Alkoxysilyl Group)

The modified hydrocarbon-based soft resin having an alkoxysilyl group can be produced by reacting the hydrogenated block copolymer (i) and/or the polyolefin-based resin (ii) with an ethylenically unsaturated silane compound in the presence of an organic peroxide.

Examples of the introduced alkoxysilyl group include a tri(alkoxy having 1 to 6 carbon atoms)silyl group such as a trimethoxysilyl group and a triethoxysilyl group; an (alkyl having 1 to 20 carbon atoms)di(alkoxy having 1 to 6 carbon atoms)silyl group such as a methyldimethoxysilyl group, a methyldiethoxysilyl group, an ethyldimethoxysilyl group, an ethyldiethoxysilyl group, a propyldimethoxysilyl group and a propyldiethoxysilyl group; an (aryl)di(alkoxy having 1 to 6 carbon atoms)silyl group such as a phenyldimethoxysilyl group and a phenyldiethoxysilyl group; and the like. In addition, the alkoxysilyl group may be bound to a hydrocarbon-based soft resin through a divalent organic group such as an alkylene group having 1 to 20 carbon atoms and an alkyleneoxycarbonylalkylene group having 2 to 20 carbon atoms.

The amount of the alkoxysilyl group introduced into the hydrocarbon-based soft resin is normally 0.1 part by weight or more, preferably 0.2 part by weight or more, more preferably 0.5 part by weight or more, and normally 10 parts by weight or less, preferably 5 parts by weight or less, more preferably 3 parts by weight or less, based on 100 parts by weight of the hydrocarbon-based soft resin. Furthermore, it is normally 0.1 to 10 parts by weight, preferably 0.2 to 5 parts by weight, and more preferably 0.5 to 3 parts by weight.

If the amount of the introduced alkoxysilyl group is too large, crosslinking between the alkoxysilyl groups decomposed by a trace amount of moisture or the like proceeds during preservation of the resulting modified hydrocarbon-based soft resin, gelation is caused and flowability during melt-forming is decreased, and thus the adhesiveness as the sealant may be decreased. Also, if the amount of the introduced alkoxysilyl group is too small, the adhesiveness with the element and the substrate of the organic electronic device may be decreased when the resin is formed as a sealant.

The ethylenically unsaturated silane compound to be used is not particularly limited as long as it graft-polymerizes with the hydrocarbon-based soft resin to introduce an alkoxysilyl group into the hydrocarbon-based soft resin. For example, vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, 3-acryloxypropyltrimethoxysilane, 3-acryloxypropyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, and the like are preferably used. Each of these ethylenically unsaturated silane compounds may be used either alone or in combination of two or more kinds.

The ethylenically unsaturated silane compound is used in an amount of normally 0.1 part by weight or more, preferably 0.2 part by weight or more, more preferably 0.5 part by weight or more, and normally 10 parts by weight or less, preferably 5 parts by weight or less, more preferably 3 parts by weight or less based on 100 parts by weight of the hydrocarbon-based soft resin. Furthermore it is normally 0.1 to 10 parts by weight, preferably 0.2 to 5 parts by weight, and more preferably 0.5 to 3 parts by weight.

As the peroxide, one having a one-minute half-life temperature of 170 to 190° C. is preferably used. For example, t-butylcumyl peroxide, dicumyl peroxide, di-t-hexyl peroxide, 2,5-dimethyl-2,5-di(t-butylperoxy) hexane, di-t-butylperoxide, di(2-t-butylperoxyisopropyl) benzene and the like are preferably used. Each of these peroxides may be used either alone or in combination of two or more kinds.

The peroxide is used in an amount of normally 0.05 to 2 parts by weight, preferably 0.1 to 1 part by weight, and more preferably 0.2 to 0.5 part by weight based on 100 parts by weight of the hydrocarbon-based soft resin.

The method for reacting the hydrocarbon-based soft resin with the ethylenically unsaturated silane compound in the presence of a peroxide is not particularly limited. For example, an alkoxysilyl group can be introduced into the hydrocarbon-based soft resin by kneading by a twin-screw kneader at a desired temperature for a desired time.

The temperature for kneading by the twin-screw kneader is normally 180 to 220° C., preferably 185 to 210° C., and more preferably 190 to 200° C.

The time for heating and kneading is normally about 0.1 to 10 minutes, preferably about 0.2 to 5 minutes, and more preferably about 0.3 to 2 minutes. Continuous kneading and extruding may be carried out so that the temperature and the detention time are within the above ranges.

The form of the produced modified hydrocarbon-based soft resin having the alkoxysilyl group is not limited, but the resin is normally formed into a pellet, which can be subjected to the subsequent production of the sealant.

(Sealant)

The sealant used in the present invention mainly includes the above-mentioned modified hydrocarbon-based soft resin. The content of the modified hydrocarbon-based soft resin in the sealant used in the present invention is normally 70 wt % or more, preferably 75 wt % or more, and more preferably 80 wt % or more based on the sealant.

In addition to the modified hydrocarbon-based soft resin as a main component, various additives can be blended into the sealant used in the present invention.

Examples of additives which can be blended include a softener for adjusting decreased adhesion temperature and adhesiveness with the elements and the substrate etc., an antioxidant and a light stabilizer for improving durability, and the like.

The softener can be blended into the modified hydrocarbon-based soft resin to adjust the flexibility of the sealant within a preferable range. As the softener, a softener capable of uniformly dissolved or dispersed in the modified hydrocarbon-based soft resin is preferred, and a low-molecular-weight (number average molecular weight: 300 to 5,000) hydrocarbon-based polymer is preferred.

Specific examples of the hydrocarbon-based polymer include a low-molecular-weight polymer such as polyisobutylene, polybutene, poly-4-methylpentene, poly-1-octene and ethylene/α-olefin copolymer, and a hydrogenated product thereof; a low-molecular-weight polymer such as polyisoprene and polyisoprene/butadiene copolymer (number average molecular weight: 300 to 5,000), and a hydrogenated product thereof; and the like.

The softener may be used either alone or in combination of two or more kinds.

Above all, particularly the low-molecular-weight hydrogenated polyisobutylene and the low-molecular-weight hydrogenated polyisoprene are preferred in that they can maintain transparency and light resistance and have an excellent softening effect.

The softener is blended in an amount of normally 25 parts by weight or less, preferably 20 parts by weight or less, and more preferably 15 parts by weight or less based on 100 parts by weight of the hydrocarbon-based soft resin. If the blending amount of the softener is too large, there is a possibility that the heat resistance of the sealant used in the present invention is decreased and eluates are readily increased.

As the antioxidant and the light stabilizer, a phosphorus-based antioxidant, a phenol-based antioxidant, a sulfur-based antioxidant, a hindered amine-based light stabilizer and the like can be used.

Each of the antioxidants and light stabilizers may be used either alone or in combination of two or more kinds.

The additive is blended in an amount of normally 3 parts by weight or less, preferably 2 parts by weight or less, and more preferably 1 part by weight or less based on 100 parts by weight of the modified hydrocarbon-based soft resin.

For the method for blending additives into the modified hydrocarbon-based soft resin, a known method commonly used as a method for producing a resin composition can be applied. For example, the modified hydrocarbon-based soft resin and additives may be uniformly mixed using a mixer such as a tumbler mixer, a ribbon blender, a Henschel type mixer, then melt-mixed by a continuous melt kneader such as a twin-screw extruder, and extruded into a pellet form to produce a modified hydrocarbon-based soft resin blended with additives.

The sealant to be used in the present invention is formed into a sheet before use. The thickness of the sheet is preferably 10 to 200 μm, more preferably 20 to 100 μm, and particularly preferably 30 to 50 μm.

When the thickness of the sheet is within the above range, an organic electronic device sealing body in which the sealing function is sufficient, unevenness due to elements, foreign matters, etc. on the substrate is covered, the thickness is uniform can be obtained.

The sheet-like sealant is normally prepared as an elongated sheet, and the organic electronic device is sealed using this sheet. The method for producing the sheet is not particularly limited, and the sheet is normally formed by a melt extrusion method.

Here, the term "elongated" refers to a type having a length at least about 5 times or more, preferably 10 times or more as long as a width of the sheet, e.g. a type having such a length that it is preserved or transported in a rolled form.

3. Step [1]

The step [1] in the method for manufacturing the organic electronic device sealing body according to one embodiment of the invention is a step of preparing a laminate by laminating the organic electronic device and a sheet-like sealant.

The laminate can be obtained by laminating the sheet-like sealant on the surface on which the organic functional element of the organic electronic device before sealed with the resin is disposed so that the organic functional element is completely covered. The sealant can be further disposed by laminating a transparent glass sheet, a transparent plastic sheet or the like as a barrier layer.

4. Step [2]

The step [2] in the method for manufacturing the organic electronic device sealing body according to one embodiment of the invention is a step that the laminate prepared in the step [1] is put into a resin bag, the resin bag is degassed, and then the resin bag containing the laminate is sealed.

The resin bag used in the sealing method according to one embodiment of the invention may be any bag as long as it contains the laminate and is degassed, and then its opening can be sealed by heat sealing or the like.

Examples of the resin constituting the bag include polyethylene (PE), polypropylene (PP), polyethylene terephthalate (PET), nylon (NY) and the like.

The resin bag may have a single layer structure or a multilayer structure. Specific examples of the layer configuration of the bag having the multilayer structure include PET layer/adherend layer/PE layer, PET layer/adherend layer/PP layer, NY layer/adherend layer/PE layer, NY layer/adherend layer/PP layer, PET layer/adherend layer/NY layer/adherend layer/PP layer, and the like.

Above all, the configurations composed of the single layer or the multilayer sheet having at least one layer excellent in heat sealing property and made of PP such as a PP single layer, the PET layer/adherend layer/PP layer, NY layer/adherend layer/PP layer are preferred, since heat resistance is high and a temperature for forming the organic electronic device can be increased. The NY layer/adherend layer/PP layer is particularly preferred since it is also excellent in piercing resistance.

In both cases of the single layer structure and the multilayer structure, the thickness of the resin bag is normally 30 to 200 μm, preferably 40 to 150 μm, and more preferably 50 to 100 μm.

In the case of the multilayer structure, the thickness of each layer is not particularly limited, and may be appropriately selected.

For example, when forming an organic electronic device in which an organic functional element is mounted on a curved glass substrate, a thin film glass substrate having a thickness of 0.2 mm or less, or the like, cracks of the glass substrate can be effectively prevented by using a thin resin bag having a thickness of 100 μm or less, in accordance with the method according to one embodiment of the invention.

In addition, for a sealable resin bag, a bag commercially available as a bag for vacuum-packing foods or the like can also be used.

In step [2], (a) first, a laminate prepared in step [1], in which the organic electronic device and the sheet-like sealant and if necessary, a glass sheet and a plastic sheet as a barrier layer are laminated, is put into the resin bag.

In the present invention, examples of the aspect "the laminate is put into the bag" include an aspect that the laminate is put into the bag from the opening of the resin bag, an aspect that the laminate is placed on one resin sheet, which is overlapped with another resin sheet, and then the outer peripheries of the two resin sheets are heat-sealed while leaving the opening without seal, and as a result, the laminate is put into the bag, an aspect that the laminate is placed on one resin sheet, the resin sheet is folded so that the laminate is contained therein, the outer periphery is heat-sealed while leaving the opening without seal, and as a result, the laminate is contained in the bag, and the like.

(b) Next, the laminate is put into the resin bag, and then the bag is degassed from the opening of the bag. The method for degassing the bag is not particularly limited, and exemplified by a method using a vacuum pump, a suction pump or the like.

(c) Subsequently, the degassed bag is sealed. The method for sealing is not particularly limited, but is exemplified by a method using a heat sealer, an infrared welder, an ultrasonic welder or the like. Also, a commercially available vacuum packer, vacuum packaging machine or the like can be used.

5. Step [3]

The step [3] in the method for manufacturing the organic electronic device sealing body according to one embodiment of the invention is a step of manufacturing the organic electronic device sealed with a sealant, wherein the bag which is sealed containing the laminate prepared in the step [2] is press-heated to adhesively integrate the laminate.

In the step [3], the bag containing the laminate and sealed is placed under a pressure of normally 0.1 MPa or higher, preferably 0.1 to 2.0 MPa, more preferably 0.2 to 1.5 MPa, and even more preferably 0.4 to 1.0 MPa.

Any pressures within this range are preferred because an autoclave sold for manufacture of laminated glasses or the like can be used.

The organic electronic device is desirably sealed with not only pressurization but also heating. The heating temperature is within such a temperature range that the organic functional element to be sealed can withstand the temperature or that the material for the resin bag can withstand the temperature. The heating temperature is normally 80 to 150°

C., preferably 90 to 140° C., and more preferably 100 to 130° C. depending on the type of the organic functional element to be sealed and the type of the resin bag.

The time for pressurization or press-heating is normally 10 to 100 minutes, preferably 15 to 70 minutes, and more preferably 20 to 40 minutes depending on conditions and the like.

When the pressure and the temperature are within the above ranges, an organic electronic device sealed with a sealant having few defects such as residual bubbles and poor adhesiveness and excellent in sealing performance can be easily manufactured.

The method for pressurization or press-heating is not particularly limited, but a method using an autoclave, a heat-press curing apparatus, a steam sterilization apparatus or the like is preferred. Use of these pressing apparatuses is also excellent in industrial productivity, because a large number of organic electronic devices can be contained in the apparatus at a time and sealed.

After completion of the press-heating, the resin bag is taken out from the pressing apparatus or the like, and the organic electronic device sealing body sealed with the sealant may be taken out from the resin bag and can be used.

Additionally, in the process of transfer, distribution and sale, etc. of products, the resin bag can be handled while being sealed and the packaging for protecting the organic electronic device sealing body sealed with the sealant being omitted, and this process is also effective for cost reduction.

EXAMPLES

Hereinafter, the present invention will be specifically explained with reference to Examples. However, the present invention is not limited to the following Examples, and can be arbitrarily modified and practiced within a range without departing from the claims of the present invention and the equivalent scope thereof.

In the following explanations, the units "%" and "parts" respectively refer to "wt %" and "parts by weight" unless otherwise indicated.

The evaluation in these Examples is carried out in accordance with the following method.
(1) Weight Average Molecular Weight (Mw) and Molecular Weight Distribution (Mw/Mn)

The molecular weights of the block copolymer and the hydrogenated block copolymer were measured as values expressed in terms of standard polystyrene determined by GPC using a THF as an eluate at 38° C. As a measuring apparatus, HLC8020GPC manufactured by Tosoh Corporation was used.
(2) Hydrogenation Ratio The hydrogenation ratios of the main chain, the side chain and the aromatic ring in the hydrogenated block copolymer were calculated by measuring $^1$H-NMR spectra.
(3) Durability of Organic Electronic Device Sealing Body The prepared organic EL device sealing body was preserved in an unlit state under an environment of a temperature of 85° C. and a humidity of 85% for 1,000 hours. Subsequently, the environment was returned to normal temperature and normal humidity (23° C., 50% humidity) environment, the device was powered and lighted, and dark spots on the light-emitting surface were observed and evaluated in accordance with the following evaluation criteria.

A case where there was no dark spot, or if any, their diameters were only smaller than 50 μm, was rated as "Good".

A case where there were a few dark spots (less than 10 spots/cm$^2$), but their diameters were 50 μm to smaller than 200 μm was rated as "Allowable".

A case where spot diameters were 50 μm to smaller than 200 μm but the number of the dark spots was large (not less than 10 spots/cm$^2$), and a case where there were dark spots having diameters of 200 μm or larger, were rated as "Bad".

[Production Example 1] Assembly (1) Including White Organic EL Element

The structure of a white organic EL element-equipped assembly (1) including a provisional sealing layer was a structure composed of the assembly 100 and the provisional sealing layer 152 schematically shown in FIG. 5. However, not only one light-emitting layer but also a hole transport layer, a plurality of light emitting layers, an electron transport layer and a buffer layer were provided between the first electrode and the second electrode.

An ITO layer was formed on a light transmissive glass substrate 101 having a length of 110 mm, a width of 65 mm and a thickness of 0.7 mm by vapor deposition (under a reduced pressure of 10$^{-4}$ Pa). This ITO layer was formed into a strip shape having a thickness of 0.25 μm, a width of 500 μm and a length of 10 mm by photolithography, to form a transparent anode as the first electrode layer 102.

Next, application of a photoresist (trade name: ZWD 6216, manufactured by Zeon Corporation) and photolithography were carried out to form the edge cover layer 103 having a thickness of 1.0 μm around the anode.

Subsequently, 4,4'-bis[N-(1-naphthyl)-N-phenylamino] biphenyl (NPB) was vapor-deposited on the anode to form a hole transport layer having a thickness of 40 nm.

Furthermore, a blue light-emitting material 4,4-bis(diphenylvinylene)-biphenyl (ADS082) was vapor-deposited on the hole transport layer to form a blue light-emitting layer having a thickness of 0.05 μm.

Subsequently, a red light-emitting material 4-(dicyanomethylene)-2-t-butyl-6-(1,1,7,7-tetramethyljulolidyl-9-enyl)-4H-pyran (DCJTB) was vapor-deposited on the blue light-emitting layer to form a red light-emitting layer having a thickness of 0.05 μm.

Subsequently, tris(8-hydroxyquinolinato) aluminum (Alq3) was vapor-deposited on the red light-emitting layer to form a green light-emitting layer having a thickness of 0.05 μm and an electron transport layer.

Furthermore, LiF was vapor-deposited on the electron transport layer to form a buffer layer having a thickness of 0.5 nm.

Subsequently, aluminum was vapor-deposited on the buffer layer to form a cathode (reflective electrode) having a thickness of 50 nm as the second electrode layer 105.

Then, silicon nitride (SiN) was vapor-deposited so as to cover the formed layer and the whole substrate, to form the provisional sealing layer 152 having a thickness of 0.3 μm.

The vapor deposition from the hole transport layer to the provisional sealing layer was continuously carried out while maintaining the condition of the pressure of 10$^{-4}$ to 10$^{-6}$ Pa.

Through the above operations, the white organic EL element-equipped assembly (1) including the provisional sealing layer was prepared.

[Production Example 2] Sealant (1)

(Modified Hydrogenated Block Copolymer (ia1-s))

A pellet of a modified hydrogenated block copolymer (ia1-s) in which 1.8 parts of vinyltrimethoxysilane bound to 100 parts of hydrogenated triblock copolymer (ia1) (Mw=48,200, Mw/Mn=1.04, hydrogenation ratio of the carbon-carbon unsaturated bonds on the main chain and the side chain and in the aromatic ring 100%) produced by polymerizing 25 parts of styrene, 50 parts of isoprene and 25 parts of styrene in this order, was produced with reference to the method described in a patent literature WO2014/077267 brochure.

(Sheet of Sealant (1))

A sheet of the sealant was prepared using a twin-screw extruder (product name: "TEM-37B", manufactured by TOSHIBA MACHINE CO., LTD) equipped with a side feeder and a T-die having a width of 400 mm, and a sheet take-off device equipped with a cast roll and a release film feeder, under the following conditions.

The sheet (thickness: 20 µm) of the sealant (1) was extruded under a forming condition of a molten resin temperature of 180° C., a T-die temperature of 180° C. and a cast roll temperature of 40° C., while continuously feeding a hydrogenated polybutene (product name: PARLEAM (registered trademark) 24, manufactured by NOF CORPORATION) from a side feeder so that the ratio of the hydrogenated polybutene was 15 parts based on 100 parts of the modified hydrogenated block copolymer (ia1-s). On the other hand, the sheet of the sealant (1) and a release PET film (thickness: 50 µm) were laminated and wound up into a roll while feeding the release PET film on the sheet surface of the sealant (1) extruded on the cast roll.

[Production Example 3] Sealant (2)

(Modified polyolefin (ii1-s)

2.0 parts of vinyltrimethoxysilane (KBM-1003, manufactured by Shin-Etsu Chemical Co., Ltd.) and 0.2 part of 2,5-dimethyl-2,5-di(t-butylperoxy) hexane (product name: "PERHEXA (registered trademark) 25B", manufactured by NOF Corporation) were added to 100 parts of a commercially available ethylene/octene copolymer (product name: "AFFINITY (registered trademark) PL1880", melting point: 100° C., manufactured by Dow Chemical Japan Ltd) pellet.

This mixture was kneaded using a twin-screw extruder at a resin temperature of 200° C. with a detention time of 80 to 90 seconds to produce 95 parts of a pellet of a modified polyolefin (ii1-s) having an alkoxysilyl group.

As a result of measuring an FT-IR spectrum of the obtained modified polyolefin (ii1-s) pellet, a new absorption band attributed to Si—OCH$_3$ group was observed at 1090 cm$^{-1}$, and new absorption bands attributed to Si—CH$_2$ group were observed at 825 and 739 cm$^{-1}$, and these regions were different from regions at 1075, 808 and 766 cm$^{-1}$ for vinyltrimethoxysilane. In addition, from the absorbance value of the IR spectrum, it was estimated that about 1.9 part of vinyltrimethoxysilane was introduced into 100 parts of the ethylene/octene copolymer.

(Sheet of Sealant (2))

A sheet (thickness: 20 µm) of the sealant (2) was extruded, and the resulting sheet of the sealant (2) and a release PET film were laminated and wound up into a roll to be recovered in the same manner as in Production Example 2, except that the modified polyolefin (ii1-s) pellet was used, the ratio of the hydrogenated polybutene to 100 parts of the modified polyolefin (ii1-s) was 5 parts, the molten resin temperature was 150° C., and the T-die temperature was 150° C.

[Production Example 4] Sealant (3)

(Modified Hydrogenated Block Copolymer (ip2-s))

2.0 parts of vinyltrimethoxysilane and 0.2 part of 2,5-dimethyl-2,5-di(t-butylperoxy) hexane were added to 100 parts of a commercially available partially-hydrogenated block copolymer (product name: "Tuftec (registered trademark) H1051", ratio of styrene/ethylene-butylene: 42/58 (weight ratio), manufactured by Asahi Kasei Chemicals Corporation) pellet, and uniformly mixed.

This mixture was kneaded using a twin-screw extruder at a resin temperature of 200° C. with a detention time of 80 to 90 seconds to produce 95 parts of pellet of modified partially-hydrogenated block copolymer (ip2-s) having an alkoxysilyl group.

As a result of measuring an FT-IR spectrum of the obtained modified partially-hydrogenated block copolymer (ip2-s) pellet, a new absorption band attributed to Si—OCH$_3$ group was observed at 1090 cm$^{-1}$, and new absorption bands attributed to Si—CH$_2$ group were observed at 825 and 739 cm$^{-1}$, and these regions were different from regions at 1075, 808 and 766 cm$^{-1}$ for vinyltrimethoxysilane. In addition, from the $^1$H-NMR spectrum, it was estimated that about 1.9 part of vinyltrimethoxysilane was introduced into 100 parts of the partially-hydrogenated block copolymer.

(Sheet of Sealant (3))

A sheet (thickness: 20 µm) of the sealant (3) was extruded, and the resulting sheet of the sealant (3) and a release PET film were laminated and wound up into a roll to be recovered in the same manner as in Production Example 2, except that the modified partially-hydrogenated block copolymer (ip2-s) pellet was used, the ratio of the hydrogenated polybutene to 100 parts of the modified partially-hydrogenated block copolymer (ip2-s) was 5 parts, the molten resin temperature was 170° C., and the T-die temperature was 170° C.

Example 1

The PET film was removed from the sheet of the sealant (1) having a thickness of 20 µm prepared in Production Example 2, and the sheet was laminated on the surface of the provisional sealing layer side of the assembly (1) including the provisional sealing layer obtained in Production Example 1. As a protective layer, a glass sheet having a thickness of 0.7 mm was further laminated thereon to obtain a laminate.

This laminate was put into a 75 µm-thick resin bag having a layer configuration of NY/adherend layer/PP. Both sides of the bag were heat-sealed by a heat sealer so that 200 mm width of the central portion on the bag opening was left without seal, and then the opening was heat-sealed while degassing the bag using a sealed packing machine (BH-951, manufactured by Panasonic Corporation) to seal the laminate.

Subsequently, the sealed laminate was put into an autoclave and press-heated at a temperature of 90° C. and a pressure of 0.8 MPa for 30 minutes to seal the light emitter-equipped assembly (1) including the provisional sealing layer.

Thereby, an organic EL device sealing body (1) having the structure schematically shown in FIG. 5, and including the assembly 100, the provisional sealing layer 152, the sealant layer 151 and the protective layer 154 was prepared.

The prepared organic EL device sealing body (1) was powered to confirm that the organic EL element lighted with no problem. Subsequently, the organic EL device (1) was preserved in an unlit state under a hot and humid environ- Example 2

An organic EL device sealing body (2) having the structure schematically shown in FIG. 5 and including the assembly 100, the provisional sealing layer 152, the sealant layer 151 and the protective layer 154 was prepared in the same manner as in Production Example 1, except that a sheet of the sealant (2) prepared in Production Example 3 was used.

The prepared organic EL device sealing body (2) was powered to confirm that the organic EL element lighted with no problem. Subsequently, the durability was evaluated in the same manner as in Example 1, and as a result, no dark spot occurred and the durability was rated as "Good".

Comparative Example 1

In the same manner as in Example 1, the assembly (1) including the provisional sealing layer obtained in Production Example 1, the sheet of the sealant (1) having a thickness of 20 μm prepared on the surface of the provisional sealing layer side in Production Example 2, and a glass sheet having a thickness of 0.7 mm as a protective layer were laminated to obtain a laminate.

This laminate was vacuum-degassed using a vacuum laminator (PVL 0202S, manufactured by Nisshinbo Mechatronics Inc.) at 90° C. for 5 minutes, and vacuum-pressed for another 20 minutes to prepare an organic EL device sealing body (3) having the structure schematically shown in FIG. 5 similar to that in Example 1.

The prepared organic EL device sealing body (3) was powered to confirm that the organic EL element lighted with no problem. Subsequently, the durability was evaluated in the same manner as in Example 1, and as a result, a plurality of dark spots having diameters of 200 μm or larger occurred around the end of the organic EL device, and the durability was rated as "Bad". Additionally, in the organic EL device sealing body (3) after the durability evaluation, the sealant layer at the end portion showed shrinkage inside the end portion of the glass sheet.

Comparative Example 2

In the same manner as in Example 2, the assembly (1) including the provisional sealing layer obtained in Production Example 1, the sheet of the sealant (2) having a thickness of 20 μm prepared on the surface of the provisional sealing layer side in Production Example 3, and a glass sheet having a thickness of 0.7 mm as a protective layer were laminated to obtain a laminate.

This laminate was processed using a vacuum laminator in the same manner as in Comparative Example 1 to prepare an organic EL device sealing body (4) having the structure schematically shown in FIG. 5.

The prepared organic EL device sealing body (4) was powered to confirm that the organic EL element lighted with no problem. Subsequently, the durability was evaluated in the same manner as in Example 1, and as a result, a large number of dark spots having diameters of 200 μm or larger occurred around the end of the organic EL device, and the durability was rated as "Bad". Additionally, in the organic EL device sealing body (4) after the durability evaluation, the sealant layer at the end portion showed shrinkage inside the end portion of the glass sheet.

Example 3

An organic EL device sealing body (5) having the structure schematically shown in FIG. 5 and including the assembly 100, the provisional sealing layer 152, the sealant layer 151 and the protective layer 154 was prepared in the same manner as in Example 1, except that the sheet of the sealant (3) prepared in Production Example 4 was used.

The prepared organic EL device sealing body (5) was powered to confirm that the organic EL element lighted with no problem. Subsequently, the durability was evaluated in the same manner as in Example 1, and as a result, dark spots having diameters of 50 to less than 200 μm occurred, but the number of them was small (less than 10 spots/cm$^2$), and the durability was rated as "Allowable".

From the results of Examples and Comparative Examples, the followings can be seen.

The organic electronic device sealing body in which the organic functional element is sufficiently sealed by the sealant is manufactured by laminating the sheet of the sealant made of the modified hydrocarbon-based soft resin having an alkoxysilyl group and the organic electronic device and heat-pressing them in an autoclave.

The manufactured organic electronic device sealing body maintains its function even after long-term preservation under a hot and humid environment (Examples 1 to 3).

Even if the sheet of the sealant made of the same modified hydrocarbon-based soft resin having an alkoxysilyl group and the organic electronic device are laminated and sealed, the resulting sealed organic electronic device sealing body readily causes dark spots around the end portion of the organic electronic device sealing body through long-term preservation under a hot and humid environment when using a general vacuum laminator as a device for sealing the organic electronic device (Comparative Examples 1 and 2).

INDUSTRIAL APPLICABILITY

The method for manufacturing the organic electronic device sealing body according to one embodiment of the invention is useful as a method for industrially manufacturing an organic electronic device excellent in durability using a sealant made of a resin having excellent sealing performance for an organic functional element.

The organic electronic device sealing body manufactured by the manufacturing method according to one embodiment of the invention is excellent in durability.

REFERENCE SIGNS LIST

10 Organic electronic device sealing body
20 Organic electronic device sealing body
30 Organic electronic device sealing body
40 Organic electronic device sealing body
50 Organic electronic device sealing body
100 Assembly
101 Substrate
101U Upper surface of substrate
102 First electrode layer
103 Edge cover layer
104 Light-emitting layer
105 Second electrode layer
151 Sealant layer
152 Provisional sealing layer 153 Adsorbent layer
154 Protective layer
500 Assembly
501 Substrate
501U Upper surface of assembly
502 Gate electrode
503 Gate electrode insulating layer
504 Source electrode
505 Drain electrode
506 Semiconductor layer
507 Layer of the sealing resin composition

The invention claimed is:

1. A method for manufacturing an organic electronic device sealing body, adhesively integrating an organic electronic device with a sheet-like sealant made of a modified hydrocarbon-based soft resin having an alkoxysilyl group, the method comprising steps of:
   step [1]: laminating the organic electronic device and the sheet-like sealant to obtain a laminate;
   step [2]: putting the resulting laminate into a resin bag, degassing the bag, and then sealing the bag containing the laminate; and
   step [3]: placing the sealed bag under a pressure of 0.1 MPa or higher to adhesively integrate the laminate, and wherein the resin bag is composed of a single-layer or multilayer sheet having at least one layer made of polypropylene.

2. The method for manufacturing the organic electronic device sealing body according to claim 1, wherein the organic electronic device is an organic electronic device including an organic EL element.

3. The method for manufacturing the organic electronic device sealing body according to claim 1, wherein the modified hydrocarbon-based soft resin having the alkoxysilyl group is a modified hydrocarbon-based soft resin obtained by introducing the alkoxysilyl group into at least one hydrocarbon-based resin selected from a hydrogenated block copolymer (i) obtained by hydrogenating a block copolymer composed of a polymer block mainly including an aromatic vinyl compound and a polymer block mainly including a chain conjugated diene compound, and a polyolefin-based resin (ii).

4. The method for manufacturing the organic electronic device sealing body according to claim 3, wherein the hydrogenated block copolymer (i) is a hydrogenated block copolymer (ia) obtained by hydrogenating 90% or more of carbon-carbon unsaturated bonds on a main chain and a side chain and carbon-carbon unsaturated bonds in an aromatic ring in a block copolymer (C) composed of at least two polymer blocks (A) mainly including a structural unit derived from an aromatic vinyl compound and at least one polymer block (B) mainly including a structural unit derived from a chain conjugated diene compound, wherein when a weight fraction of the whole polymer block (A) relative to the whole block copolymer (C) is defined as wA and a weight fraction of the whole polymer block (B) relative to the whole block copolymer (C) is defined as wB, a ratio of wA and wB, wA:wB is 20:80 to 60:40.

\* \* \* \* \*